(12) United States Patent
Yang

(10) Patent No.: US 9,478,546 B2
(45) Date of Patent: Oct. 25, 2016

(54) LC MODULE LAYOUT ARRANGEMENT FOR CONTACT OPENING ETCH WINDOWS

(71) Applicant: Macronix International Co., Ltd., Hsinchu (TW)

(72) Inventor: Chin Cheng Yang, Kaohsiung County (TW)

(73) Assignee: MACRONIX INTERNATIONAL CO., LTD., Hsinchu (TW)

(*) Notice: Subject to any disclaimer, the term of this patent is extended or adjusted under 35 U.S.C. 154(b) by 34 days.

(21) Appl. No.: 14/515,739

(22) Filed: Oct. 16, 2014

(65) Prior Publication Data

US 2016/0111429 A1 Apr. 21, 2016

(51) Int. Cl.
*H01L 27/105* (2006.01)
*H01L 23/528* (2006.01)
*H01L 23/532* (2006.01)
*H01L 21/311* (2006.01)
*H01L 21/3213* (2006.01)

(52) U.S. Cl.
CPC ......... *H01L 27/1052* (2013.01); *H01L 23/528* (2013.01); *H01L 23/5329* (2013.01); *H01L 23/53271* (2013.01); *H01L 21/31144* (2013.01); *H01L 21/32139* (2013.01)

(58) Field of Classification Search
CPC .................................................. H01L 27/1052
See application file for complete search history.

(56) References Cited

U.S. PATENT DOCUMENTS

| | | | | |
|---|---|---|---|---|
| 8,227,897 B2* | 7/2012 | Kim | ............... | H01L 23/5228 257/536 |
| 8,405,141 B2* | 3/2013 | Matsuda | ............ | H01L 27/11573 257/324 |
| 8,809,938 B2* | 8/2014 | Hwang | .............. | H01L 27/11565 257/324 |
| 2009/0230449 A1* | 9/2009 | Sakaguchi | ........... | H01L 27/0688 257/298 |
| 2010/0213526 A1* | 8/2010 | Wada | ................ | H01L 21/76808 257/314 |
| 2010/0320526 A1* | 12/2010 | Kidoh | ................... | H01L 23/522 257/324 |
| 2012/0238093 A1* | 9/2012 | Park | .................. | H01L 21/76838 438/675 |

* cited by examiner

*Primary Examiner* — Lex Malsawma
(74) *Attorney, Agent, or Firm* — Stout, Uxa & Buyan, LLP; Frank J. Uxa

(57) ABSTRACT

A lay-out arrangement for LC modules in 3D semiconductor memories is described that avoids large step height. The arrangement creates insulating/conducting layer pairs with adjacent pairs differing in height by no more than the thickness of two insulating/conducting layer pairs.

13 Claims, 18 Drawing Sheets

LC MODULE LAYOUT ARRANGEMENT FOR CONTACT OPENING ETCH WINDOWS

BACKGROUND OF THE INVENTION

1. Field of the Invention

The present invention relates generally to semiconductor devices and, more particularly, to formation of three-dimensional memory modules.

2. Description of Related Art

As densities of semiconductor memories increase, two-dimensional structures are no longer able to meet specified requirements. Accordingly, three-dimensional memories are becoming known, although manufacturing processes for fabricating three-dimensional memories pose special problems. One approach to creating memory structures in three dimensions involves forming memory elements disposed in horizontal layers of staircase structures and then providing access to the conducting surface levels of the layers by connecting the layers to a control layer with vertical conducting elements disposed in contact openings. The staircase structures may be formed by first laying down alternating layers of insulating and conducting material. Sequential mask/photo/etch steps can then be performed with photoresist being incrementally peeled back between etch steps. Performing etches of monotonically increasing depth creates multiple steps of staircase structures. When the number of etch steps is large, this approach forms large discontinuities between levels of adjacent surfaces in semiconductor structures. These large discontinuities may cause critical dimensions to be compromised, thereby reducing a contact patterning overlay margin and creating an unwanted etch-through issue.

A need thus exists in the prior art for multilayer semiconductor structures that do not exhibit large discontinuities between adjacent conducting surface levels. A further need exists for a method of forming such multilayer semiconductor structures.

SUMMARY OF THE INVENTION

The present invention addresses these needs and others by providing a three-dimensional semiconductor memory structure comprising a plurality of LC modules, the modules comprising contact pads and layer-by-layer openings for contact pads. The LC modules are disposed on a plurality of levels, each level being formed from one or more pairs of alternating layers of conducting material and insulating material (OP layer pairs) wherein a height difference between surfaces of adjacent levels does not exceed a thickness of two OP layer pairs.

Particular implementations of the invention herein disclosed comprise eight or fewer LC modules. Other examples of the present invention include more than eight LC modules. LC modules may be designated as odd-numbered or even-numbered, the zero-numbered LC module being designated to be even-numbered.

According to an example, a height difference between surfaces of consecutively numbered LC modules is a thickness of one OP layer pair.

According to an example, the surface of the zero-numbered LC module is the tallest or highest surface or surface level, and the surface of the highest-numbered LC module is the shortest (or lowest) surface or surface level. In one example, the odd-numbered surfaces or surface levels are grouped side by side and the even-numbered surfaces or surface levels are grouped side by side so that the surface or surface level having the highest odd number is adjacent the level having the highest even number.

An aspect of the present invention includes a method of forming a collection of LC modules for a three-dimensional semiconductor memory. One implementation of the method comprises providing a semiconductor stack on a substrate, the stack including a thick insulating layer on which are formed alternating conducting/insulating material layer pairs (OP layer pairs). In one implementation, the method defines a plurality of etch positions. A sequence of etches is performed on the semiconductor stack to create a plurality of distinct surfaces or surface levels (at the etch positions) such that no adjacent surfaces or surface levels differ in height by more than a thickness of two OP layer pairs.

In one example, the method is adapted to create LC modules corresponding to a number of etch positions equal to a power of two. Implementations of the method may create any even number of etch positions, or may create any odd number of etch positions.

While the apparatus and method has or will be described for the sake of grammatical fluidity with functional explanations, it is to be expressly understood that the claims, unless indicated otherwise, are not to be construed as limited in any way by the construction of "means" or "steps" limitations, but are to be accorded the full scope of the meaning and equivalents of the definition provided by the claims under the judicial doctrine of equivalents.

Any feature or combination of features described or referenced herein are included within the scope of the present invention provided that the features included in any such combination are not mutually inconsistent as will be apparent from the context, this specification, and the knowledge of one skilled in the art. In addition, any feature or combination of features described or referenced may be specifically excluded from any embodiment of the present invention. For purposes of summarizing the present invention, certain aspects, advantages and novel features of the present invention are described or referenced. Of course, it is to be understood that not necessarily all such aspects, advantages or features will be embodied in any particular implementation of the present invention. Additional advantages and aspects of the present invention are apparent in the following detailed description and claims that follow.

DETAILED DESCRIPTION OF THE INVENTION

Figure 1:
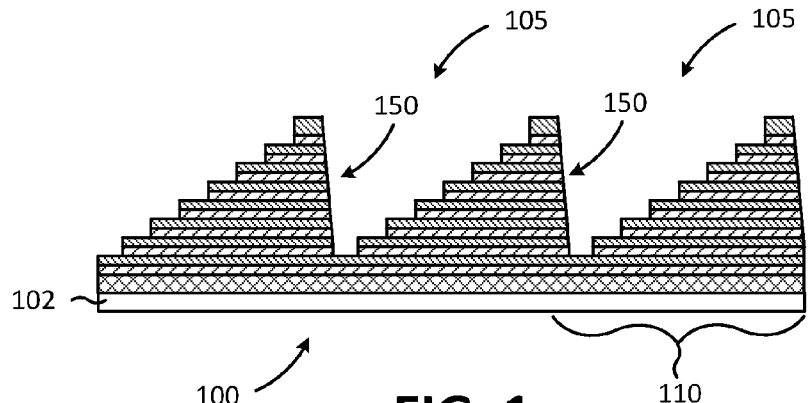
FIG. 1 is a cross-sectional view of a portion of a prior art three-dimensional semiconductor memory device formed of alternating insulating/conducting layers (OP layer pairs)

Examples of the invention are now described and illustrated in the accompanying drawings, instances of which are to be interpreted to be to scale in some implementations while in other implementations, for each instance, not. In certain aspects, use of like or the same reference designators in the drawings and description refers to the same, similar or analogous components and/or elements, while according to other implementations the same use should not. According to certain implementations, use of directional terms, such as, top, bottom, left, right, up, down, over, above, below, beneath, rear and front, are to be construed literally, while in other implementations the same use should not. The present invention may be practiced in conjunction with various integrated circuit fabrication and other techniques that are conventionally used in the art, and only so much of the commonly practiced process steps are included herein as are necessary to provide an understanding of the present invention. The present invention has applicability in the field of semiconductor devices and processes in general. For illustrative purposes, however, the following description pertains to three dimensional semiconductor memory devices and related methods of manufacture.

Referring more particularly to the drawings, FIG. 1 illustrates, in cross-section, a portion of a prior art three-dimensional semiconductor memory device, in particular, a structure 100 comprising collections of contact pads and layer-by-layer openings for contact pads (LC modules).

Figure 2:
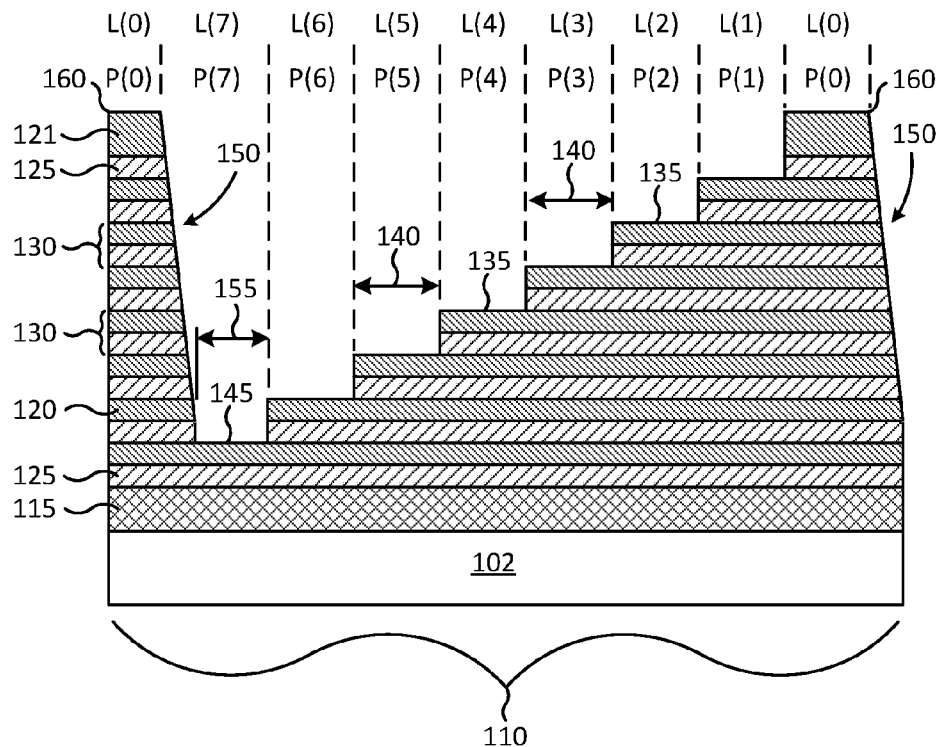
FIG. 2 is a detailed view of a portion of the prior art structure of FIG. 1 illustrating a large difference between levels of adjacent OP layer pairs.

Detail of a portion 110 of the illustrated structure 100 is shown in FIG. 2, which identifies a substrate 102 formed of, for example, atoms of material from group IVA of the periodic table of the elements. Germanium and silicon are typical examples. A relatively thick layer of insulating material (e.g., oxide) 115, which may form a base layer, may be deposited on the substrate 102, and a staircase of alternating layers of conducting material 125 and insulating material 120 may be formed on the oxide layer 115. The conducting layers 125 may be formed of any suitable conducting material, for example, polycrystalline silicon, which may be referred to herein as polysilicon; the insulating layers 120 may be formed of any suitable insulating material, for example, an oxide, e.g., an oxide of silicon such as $SiO_2$, SiOC or SiOF. The pairs of alternating layers of conducting and insulating material may be referred to herein as OP layer pairs 130. Eight such OP layer pairs 130 are illustrated in FIG. 2, although the number of layer pairs may be larger or smaller than eight, e.g., 2, 4, 16, 32, or more in some implementations. The conducting (polysilicon) layers 125 may range in thickness between about 15 nm and about 30 nm, typically about 20 nm; the insulating (oxide) layers 120 may range in thickness between about 20 nm and about 50 nm with typical thicknesses being about 40 nm. The uppermost insulating layer 121 as well as the base layer 115may be thicker than the oxide layers 120 in order to address fabrication process concerns.

The structures of FIGS. 1 and 2 may be created by steps of masking, applying photoresist, etching, pulling back photoresist, and repeating the steps to form a required number (e.g., eight) of distinct surface levels or surfaces of the OP layer pairs, which may be referred to as contact pads or landing pads 135, for example, because etch steps creating openings above the OP layer pairs must "land" on the contact pads as described below with reference to FIGS. 2A and 2B. The surfaces of the OP layer pairs may be referred to herein simply as "levels" or "surfaces" when no confusion results from such reference.

An OP layer pair may comprise an upper and lower layer wherein the upper layer is an insulating layer and the lower layer is a conducting layer having substantially no electrical connection to any other conducting layer. A later manufacturing step (summarized below with reference to FIGS. 2A may form vertical conducting structures to create connections with the individual conducting layers (i.e., to the landing pads 135) as part of a three-dimensional memory structure. The landing pads 135 (except for a lowest landing pad 145) have a width 140 that may have a typical value of about 150 nm that may range from about 100 nm to about 250 nm.

For convenience, etch positions (which may correspond to landing pads) are identified in FIG. 2 and later figures as P(0), P(1), . . . , P(7). A depth of etch at each position determines a level for the respective landing pads. The levels are identified in the present example (FIG. 2) as L(0), L(1), . . . , L(7) where L(i) refers to a number of OP layer pairs removed by an etch process that forms the $i^{th}$ level.

As illustrated in FIGS. 1 and 2, the structure 100 includes a large (i.e., relatively tall) stack 160 of OP layer pairs 130 at level L(0), i.e., the highest level, located at position P(0) adjacent to a particular landing pad 145 disposed at level L(7), i.e., the lowest level, at etch position P(7) of the staircase. The juxtaposition of levels L(0) and L(7) results in a maximum level difference, i.e., a height difference, equal to the thickness of seven OP layer pairs in the present example. More generally, when a number, N, of OP layer pairs are used, this maximum level difference, between L(0) and L(N-1), is (N-1)×(OP thickness).

The tall stack 160 may have associated with it a taper 150 having an angle with the vertical ranging between about zero degrees (no taper) to about one to three degrees. Control of the value of the taper angle is difficult, and any positive value of taper angle may be considered to be parasitic. A positive taper angle inevitably produces a reduction of a post-etch critical dimension (ECD) 155 of the lowest landing pad 145 by an approximate amount (N-1)×(taper angle)×(OP thickness). That is, the width 155 of the lowest landing pad 145 may be less (e.g., significantly less) than the width 140 of the remainder of the landing pads 135. The reduced width 155 necessarily increases difficulty of accurately placing a vertical connecting structure in contact with the lowest landing pad 145. Failure to achieve such placement may undesirably result in a defect in manufacture of the memory device.

One prior art method of etching to create the staircase structure 100 employs seven sequential etch steps, as each set of OP layer pairs 130 is etched individually. For example, with reference to FIG. 2 where positions of the seven etches are numbered P(0)-P(7), an implementation of such a method may remove one OP layer pair 130 in position P(7), photoresist may be pulled back, and one OP layer pair 130 may be removed in positions P(6)-P(7). These procedures may be repeated by removing an additional OP layer pair 130 in positions P(5)-P(7) and so on. Eventually, seven such etch steps remove seven OP layer pairs 130 in position P(7), six OP layer pairs 130 are removed in position P(6), and so on with a single OP layer pair 130 in position P(1) being removed at the seventh etch step. The level at position P(0) is not etched in this example.

Figure 2A:
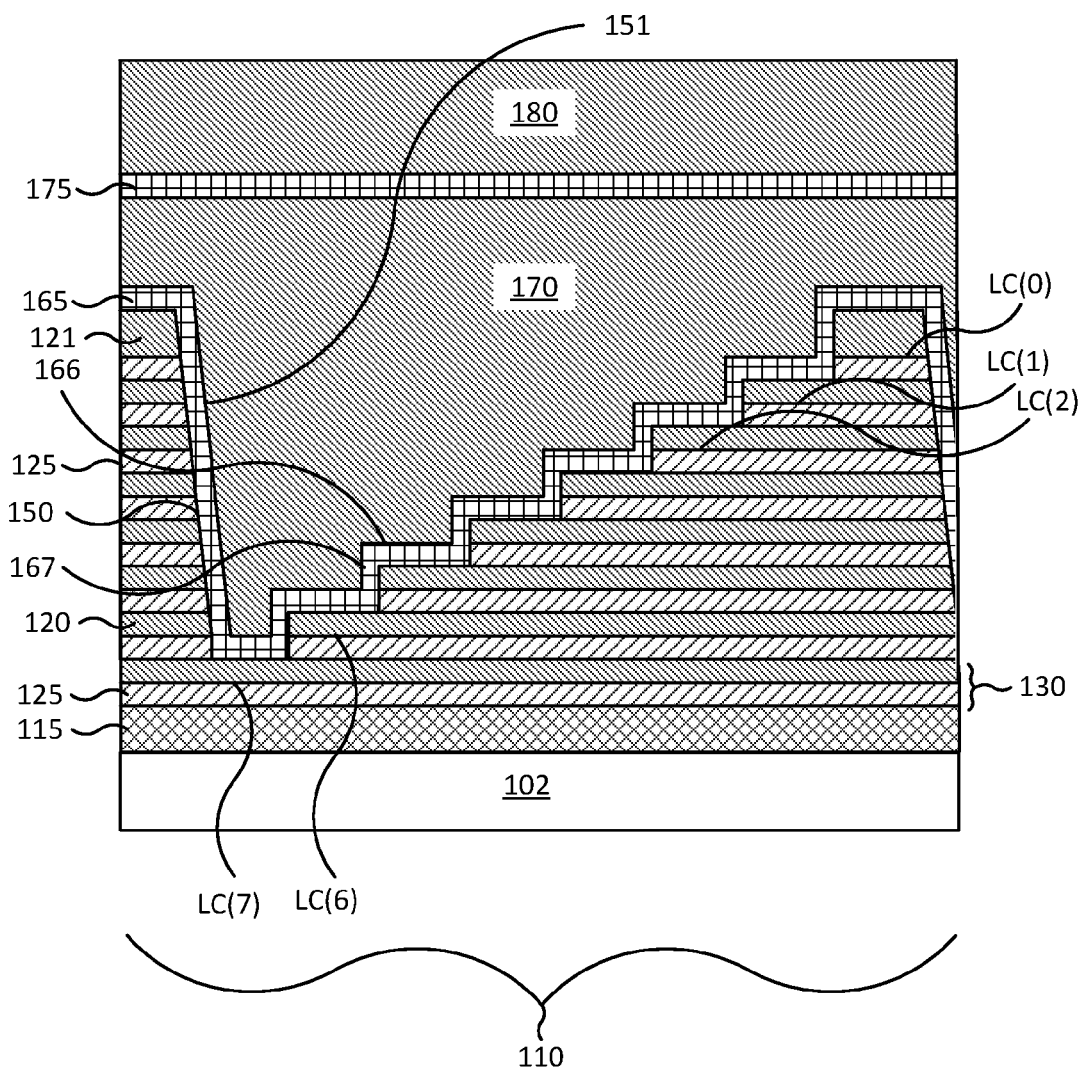
FIG. 2A is a conceptual sketch of the structure of FIG. 2 after processing to prepare for formation of contact openings according to prior art.
Figure 2B:
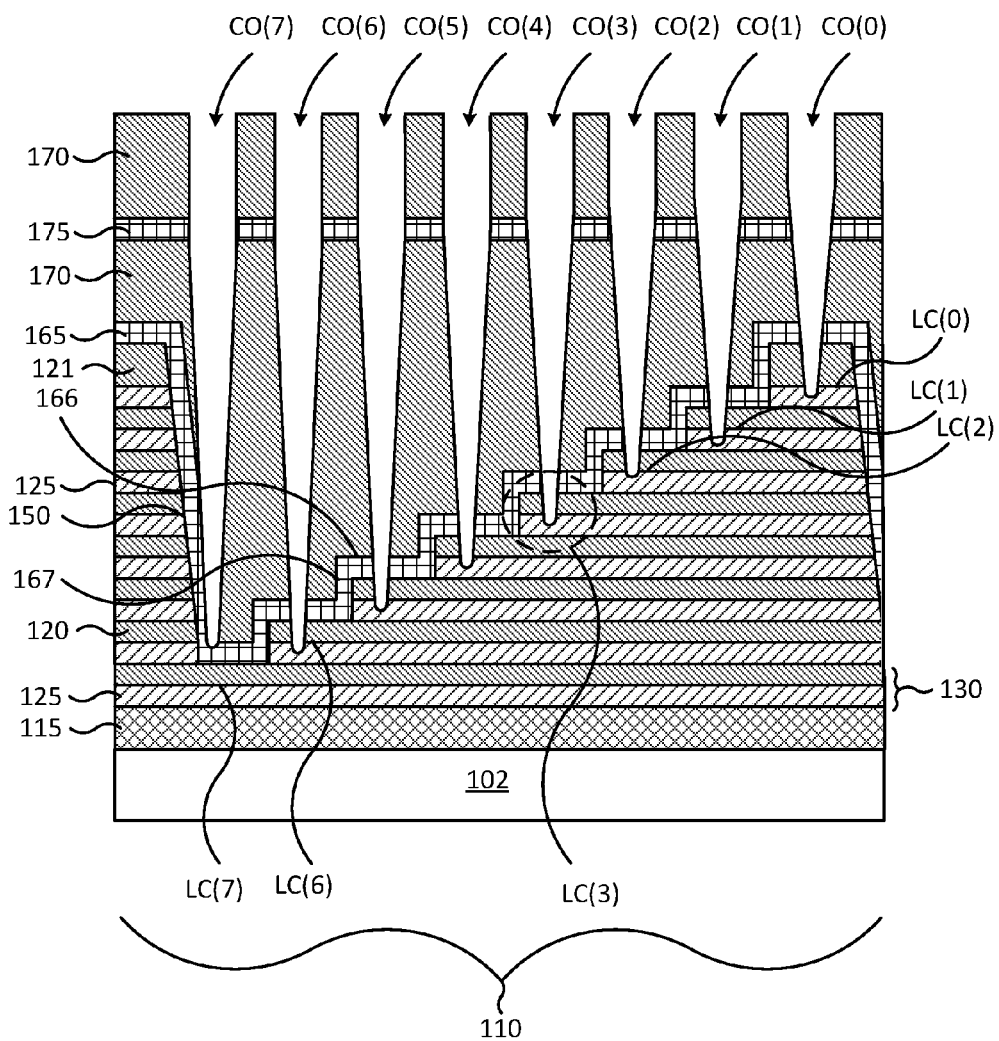
FIG. 2B illustrates the prior art structure of FIG. 2A after formation of contact openings.

FIGS. 2A and 2B illustrate results of processing steps applied to the prior art structure of FIG. 2 to create contact openings that facilitate electrical connections with landing pads 135. The process steps may include, as shown in FIG. 2A, overlaying the structure of FIG. 2 with, for example, a layer of silicon nitride (SiN) 165. The SiN may function as a stop layer 166 on upper surfaces of landing pads and may function as a spacer 167 on sides of the landing pads. Subsequently an oxide layer, which may be referred to as LC oxide film 170, may be overlaid on the SiN layer 165. A chemical mechanical planarization (CMP) step may prepare the LC oxide film 170 for deposition of another layer of SiN, referred to herein as contact opening (CO) SiN film 175. A further oxide layer, e.g., CO oxide film 180, may be deposited on the CO SiN film 175, and the result may be planarized by CMP.

FIG. 2B illustrates a result of formation of contact openings CO(0), CO(1), . . . , CO(7) in the structure of FIG. 2A. The formation may be achieved by photolithographic methods involving several etch steps, including a first etch step that forms an upper portion of the contact openings. The first etch step, which may use the CO SiN film 175 as a stop layer, may form contact openings having substantially vertical, straight sides as illustrated in FIG. 2B. Subsequently, a second etch step may remove CO SiN film 175 already exposed by the first etch step, and a third etch step may remove material of the LC oxide film 170 below the CO SiN film 175, the third etch step terminating on the SiN stop layer 166. A fourth etch step may punch through the SiN stop layer 166 and each underlying oxide layer 120 to create layer-by-layer contact openings for landing pads. The landing pads (i.e., contact pads) and the contact opening for the pads may be identified as LC modules LC(0), LC(1), . . . , LC(7). The structure of FIG. 2B contains eight such LC modules.

Figure 2C:
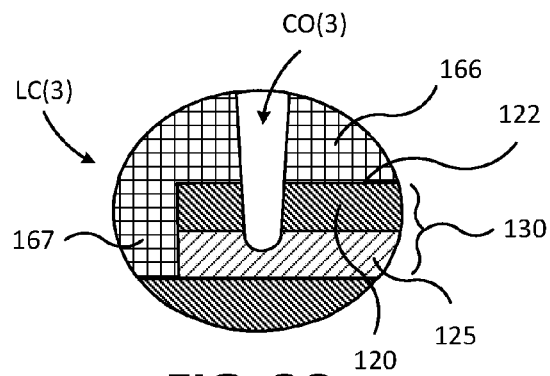
FIG. 2C is a detailed sketch of an LC module illustrating the contact pad and layer-by-layer opening for the contact pad.

Detail of a representative LC module LC(3) is illustrated in FIG. 2C showing that an LC module (e.g., LC(3)) comprises a contact pad formed of the conducting layer 125, which is part of the OP pair 130 which also comprises an insulating layer 120. Generally, an upper boundary 122 of the insulating layer 120 may be referred to herein as a surface, level, or surface level of an LC module. SiN material is illustrated, being represented as SiN spacer material 167 and the SiN stop layer 166. When filled with conducting material, the contact opening CO(3) (i.e., an example of a layer-by-layer opening) provides an electrical connection to the contact pad (i.e., landing pad).

For the example illustrated in FIG. 2B, the fourth etch step successfully reaches conducting layer 125 to form LC module LC(0). The same fourth etch step in this example successfully creates LC modules LC(1), LC(2), . . . , LC(6). Formation of LC(7), however, is impeded by the tapered surface 151 of the overlay of SiN material 165 on the sidewall of the tall stack 160 (FIG. 2). Consequently, the fourth etch step may (as illustrated in FIG. 2B) fail to reach the conducting layer 125 corresponding to LC(7). In other examples, the fourth etch step may create only a partial landing on LC(7). In either case, subsequent fill-in of the contact openings CO(0)-CO(7) with conducting material may fail to create an electrical connection with the #7 landing pad with the result that a high-resistance connection, or even a void, may be created, resulting in a so-called blind hole at the bottom of CO(7). It is an object of the present disclosure to describe a method of eliminating the difficulty just described.

Figure 3:
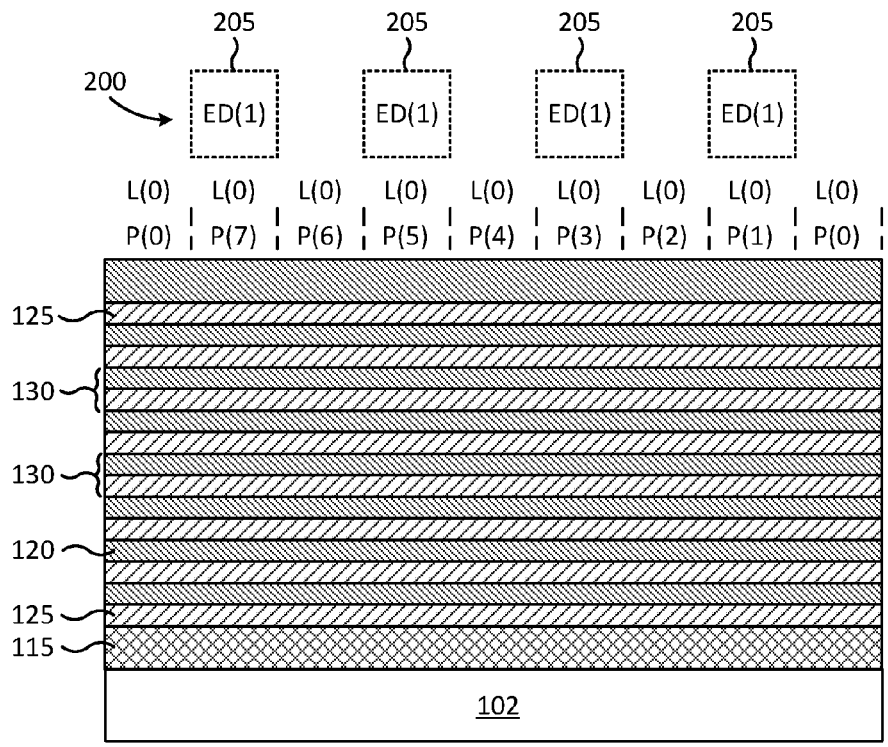
FIG. 3 is a cross-sectional view of an unprocessed semiconductor stack of eight OP layer pairs and a specification of a first etch step.
Figure 4:
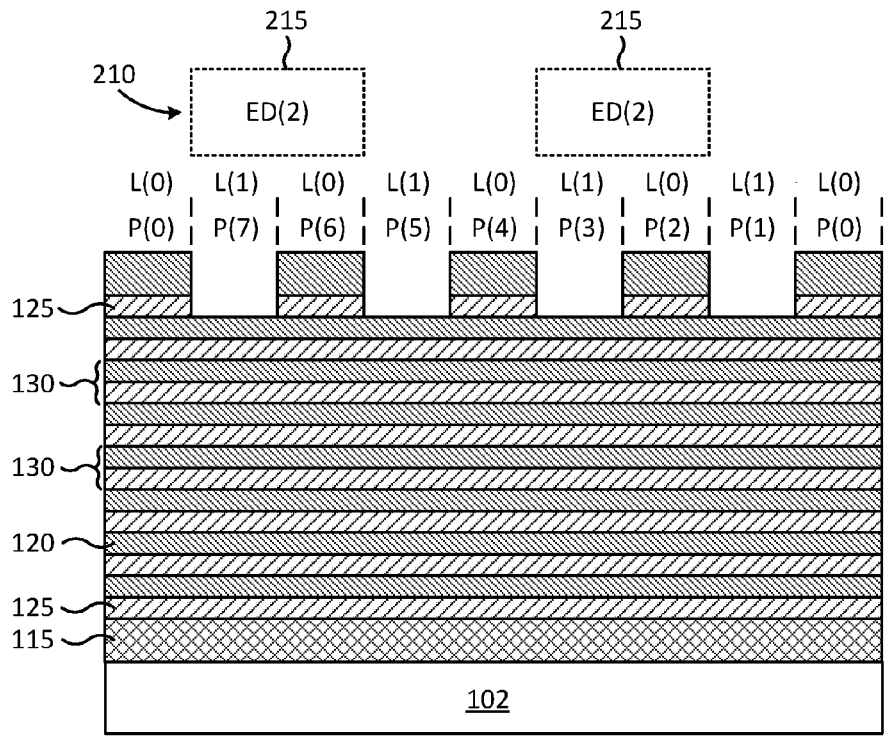
FIG. 4 illustrates a result of the first etch step applied to the structure of FIG. 3 and includes a specification of a second etch step.
Figure 5:
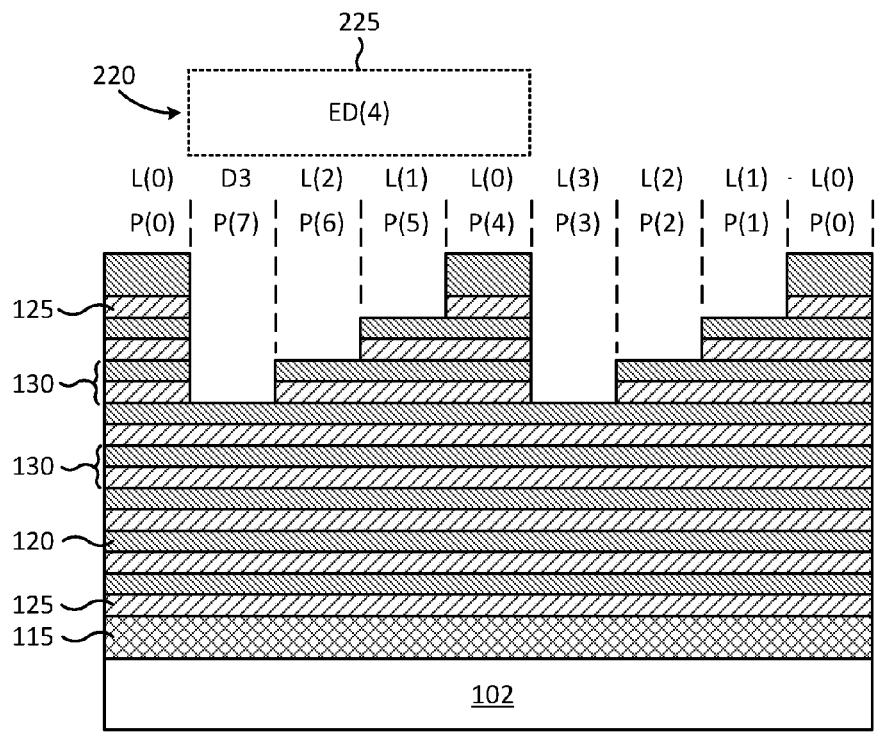
FIG. 5 is a pictorial representation of a result of the second etch step applied to the structure of FIG. 4, further prescribing a third etch step.

Returning to FIG. 2, the illustrated staircase structure may be constructed with not seven, but only three etch steps as illustrated in FIGS. 3-5. The three-step process illustrated in these figures begins with an unprocessed stack of OP layer pairs 130 as shown in FIG. 3. Positions P(0)-P(7) are identified in the figure, each position having associated therewith a level L(0) prior to the performing of any etch steps. A first mask/photo/etch procedure is performed on the structure of FIG. 3 using a mask 200 characterized by openings 205 and an etch depth ED(1), wherein the notation ED(i) indicates that i OP levels are to be removed by the etch procedure. The first procedure (having an etch depth ED(1)) removes one (i.e., the topmost) of the OP layer pairs 130 from alternate positions of the stack (e.g., positions P(1), P(3), P(5), P(7)). The result of this first procedure is shown in FIG. 4. As illustrated, positions P(1), P(3), P(5), and P(7)

have one OP layer removed (denoted by L(1)); the remaining positions have no OP layers removed (denoted by L(0)).

A second mask/photo/etch procedure uses a second mask 210 having openings 215 covering two etch positions and an etch depth ED(2). This procedure removes material from two levels of OP layer pairs in positions P(2)-P(3) and P(2)-P(7). The result of the second etch is shown in FIG. 5, wherein positions P(1) and P(5) are etched to level L(1), positions P(2) and P(6) are etched to level L(2), and positions P(3) and P(7) are etched to level L(3). Positions P(0) and P(4) have not been etched.

A final mask/photo/etch step using a third mask 220 having an opening 225 and an etch depth ED(4) removes material from four contiguous positions P(4)-P(7)).

The three etch steps just described result in a structure substantially identical to that illustrated in FIG. 2.

The three-step protocol applied to eight OP layer pairs as just described generalizes in a straightforward manner to a four-step procedure for sixteen OP layer pairs. Similarly 5, 6, and 7 steps may be required for structures having, respectively, 32, 64, and 128 OP layer pairs, for example. In general, the number of etch steps required for N levels is $\log_2(N)$ when N is a power of 2.

Although the protocol may reduce the number of etch steps required to form LC modules, its use does not reduce the large maximum level difference between adjacent landing pad positions. That is, this procedure does not solve the maximum level difference problem outlined above.

The present disclosure describes a design employing a novel layout arrangement and etching procedure that results in a modified structure with LC modules having a maximum adjacent conducting surface or level difference of two OP layer pairs. This arrangement may substantially eliminate the reduction in ECD 155 (FIG. 2). Consequently, the arrangement may eliminate premature stopping of etch steps as described above with reference to CO(7)/LC(7) in FIG. 2B. The modified structure retains substantially the same functionality as the structure illustrated in FIGS. 1 and 2, while providing one or more advantages over the prior art structure.

Figure 10:
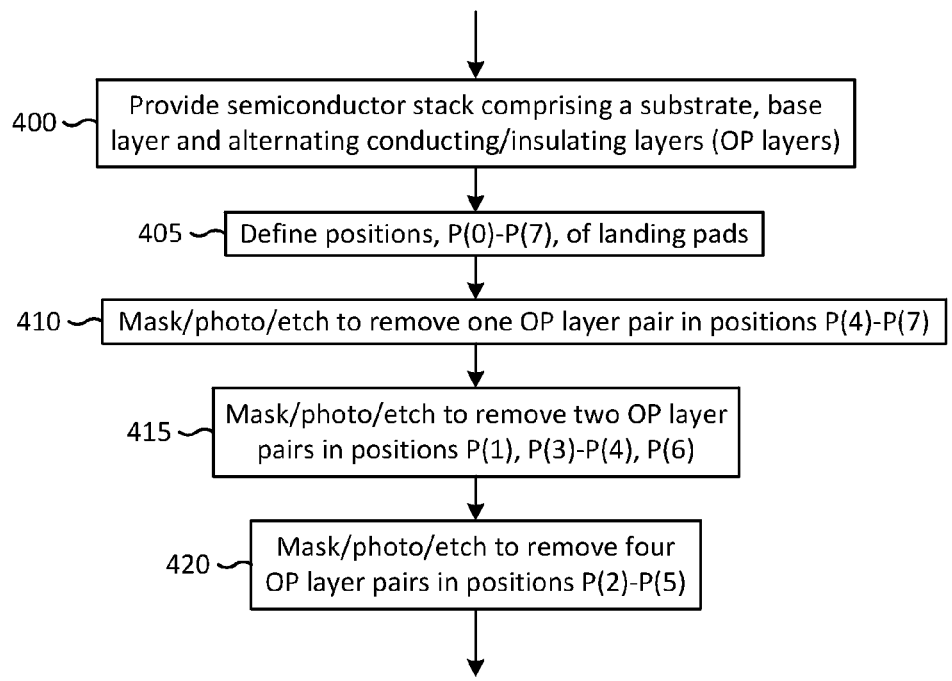
FIG. 10 is a flowchart describing an implementation of a mask/photo/etch process for forming the structure of FIG. 9 having eight OP layer pairs.

An implementation of one example of the etching procedure in accordance with the present invention is summarized in flowchart form in FIG. 10 for a case of eight landing pads. The implementation begins by providing, at step 400, a semiconductor stack comprising a substrate, a base layer and a plurality of OP layer pairs constructed as described above. Positions of landing pads P(0)-P(7) are identified at step 405.

Figure 6:
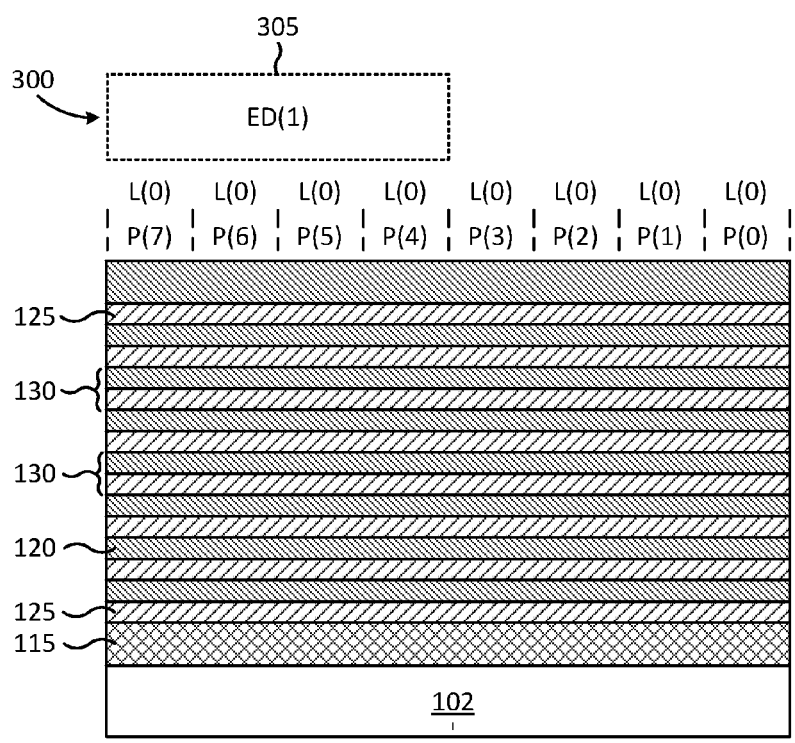
FIG. 6 is a cross-sectional view of an unprocessed semiconductor stack of eight OP layer pairs and a specification of a first etch step different from that specified in FIG. 3.

An example of such a stack is illustrated in FIG. 6 wherein are labeled etching positions P(0)-P(7) corresponding to landing pads to be formed. A level of zero (L(0)) is indicated in each position P(0)-P(7) prior to commencement of etching.

Figure 7:
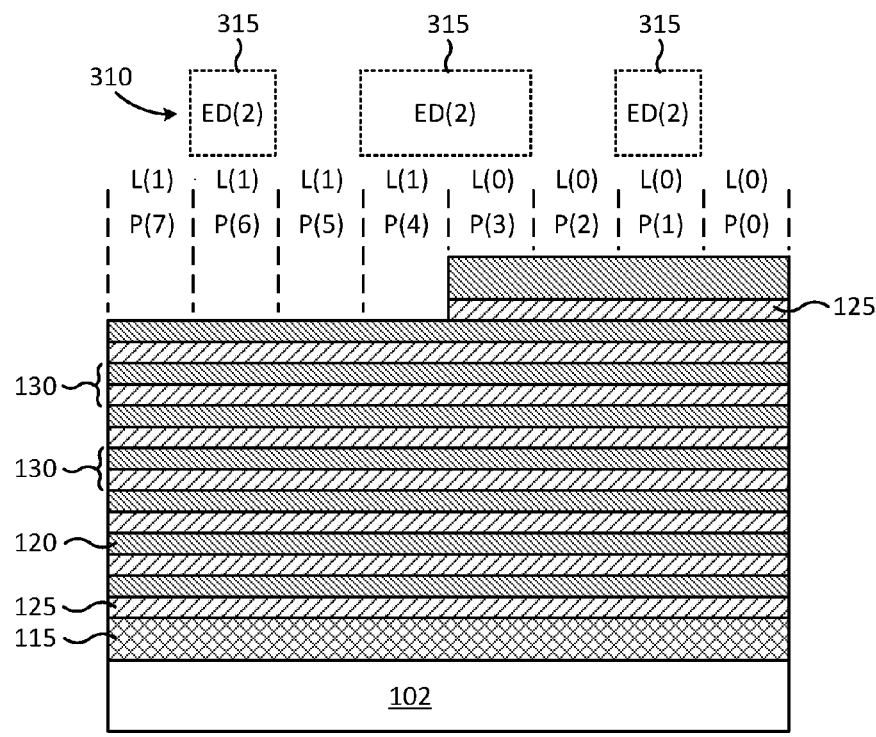
FIG. 7 shows an effect of the first etch step applied to the structure of FIG. 6 and specifies a second etch step.

At step 410 a first mask/photo/etch procedure is performed to remove one OP layer in positions P(4)-P(7). The mask/photo/etch step is configured to remove one OP layer of material according to an arrangement 300 with an opening 305 and an indicated etch depth ED(1) as shown in FIG. 6. The diagram indicates that material is to be removed in the area directly below the opening 305. Subsequent to the removal, the structure appears as illustrated in FIG. 7, wherein it is indicated that positions P(0)-P(3) have been etched to level L(0) (i.e., not etched) and positions P(4)-P(7) have been etched to level L(1) (i.e., one OP layer pair has been removed).

Figure 8:
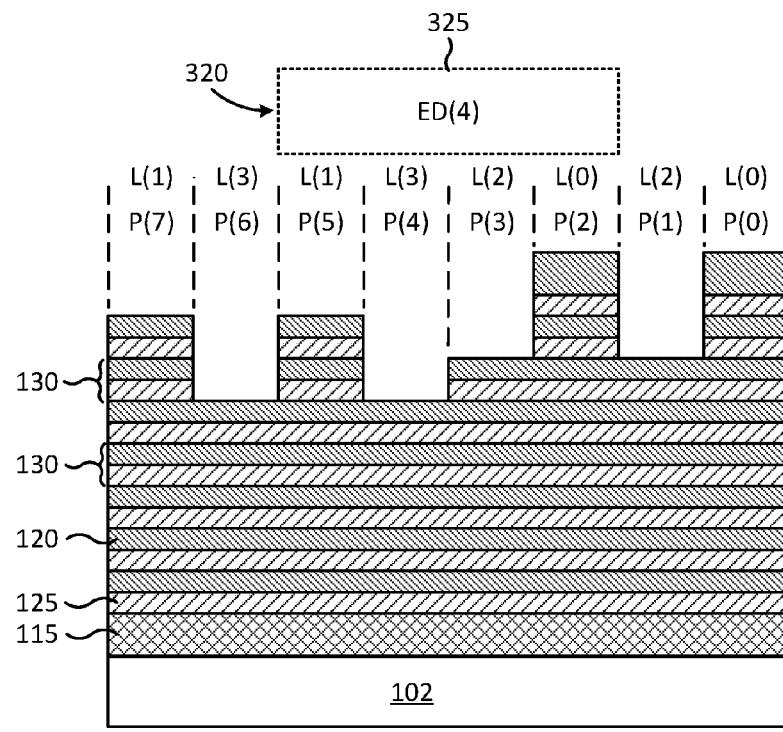
FIG. 8 illustrates a result of the second etch step and prescribes a third etch step to be applied to the structure of FIG. 7.

At step 415 a second mask/photo/etch operation is performed that removes two OP layers according to an arrangement 310 (FIG. 7) that indicates removal of material according to openings 315 with an etch depth ED(2). That is, two OP layer pairs are to be removed from positions P(1), P(3), P(4), and P(6). The result of the removal is shown in FIG. 8, wherein positions P(2) and P(0) have not been etched (level is L(0)), positions P(5) and P(7) have been etched to level L(1), positions P(1) and P(3) have been etched to level L(2), and positions P(4) and P(6) have been etched to level L(3).

A final mask/photo/etch procedure may be performed at step 420 that removes four OP layer pairs according to an arrangement 320 (FIG. 8) comprising an opening 325 with an etch depth ED(4). That is, material is removed from positions P(2)-P(5). The removal produces a result illustrated in FIG. 9 wherein positions P(0)-P(7) are etched to respective levels L(0), L(2), L(4), L(6), L(7), L(5), L(3), and L(1). The height difference between any two adjacent positions is either one OP layer thickness or two OP layer thicknesses.

Figure 9:
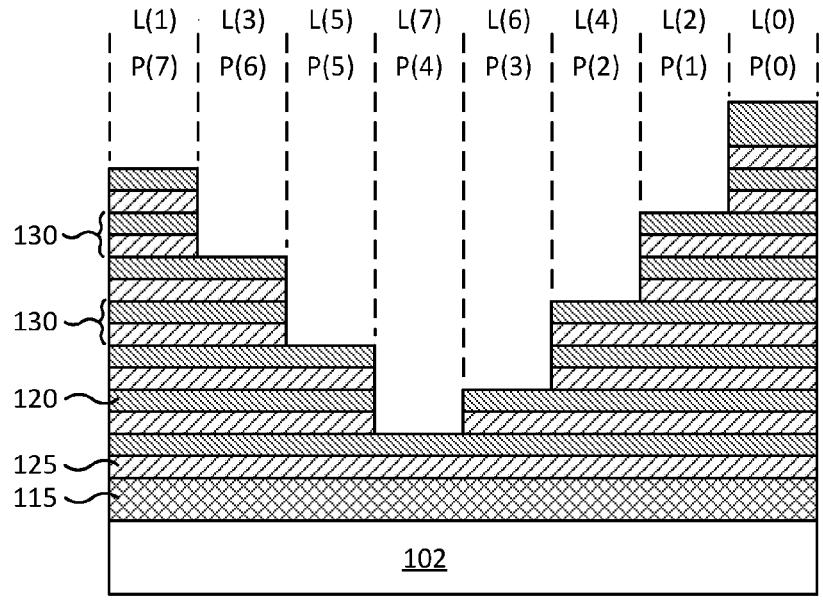
FIG. 9 describes an appearance of the structure of FIG. 8 after application of the third etch step illustrating that a maximum difference between adjacent levels is a thickness of two OP layer pairs.

The example of FIG. 9 also demonstrates that the level difference between consecutively numbered levels (i.e., L(6) and L(7) in respective positions P(3) and P(4)), equals one, corresponding to a thickness of one OP layer pair. Further, L(0) is noted to be the tallest (i.e., highest) level or surface, and the highest-numbered level or surface, L(7) is noted to be the shortest (i.e., lowest) level or surface. Odd-numbered levels or surfaces in FIG. 9 are grouped side by side, as are the even-numbered levels or surfaces. The highest odd-numbered level or surface (i.e., L(7)) and the highest even-numbered level or surface (i.e., L(6)) are positioned side by side. Also, the lowest odd-numbered level or surface (i.e., L(1)) and the zero-numbered level or surface (i.e., L(0)) are positioned to be furthest away from each other.

Although the example just given applies to structures having eight LC modules, the method disclosed herein may be employed on structures having any number of OP layer pairs.

Figure 11:
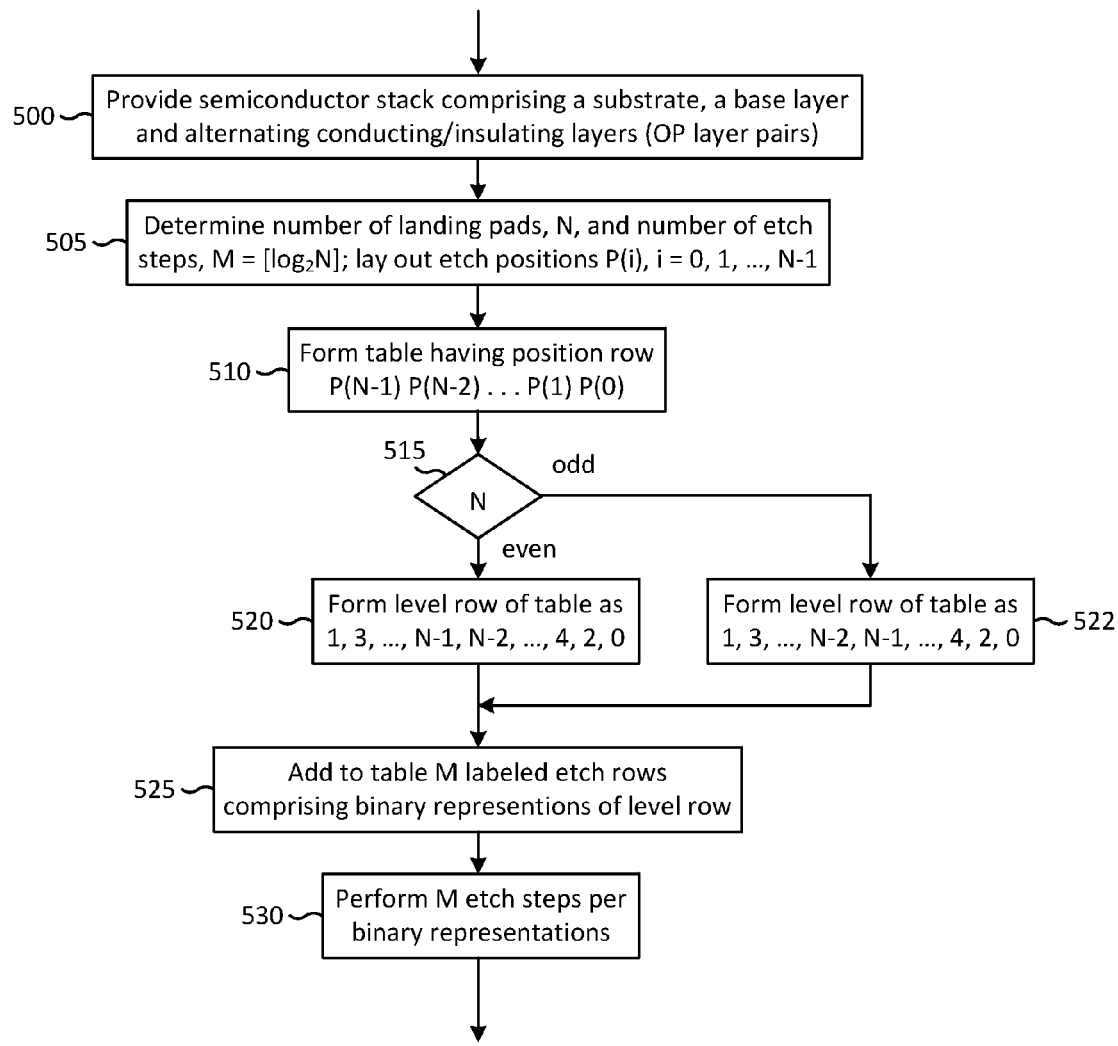
FIG. 11 is a flowchart that describes an implementation of a general mask/photo/etch process for forming three-dimensional memory structures having an arbitrary number of OP layer pairs.

An outline of one implementation of the method that can be used to process a stack with any number of layer pairs is presented in the flowchart of FIG. 11. According to the illustrated implementation, a semiconductor stack comprising a substrate, a base layer and alternating conducting/insulating layers (e.g., OP layer pairs) is provided at step 500. A number of landing pads (surfaces or levels), N, is determined at step 505, landing pad (surface or level) positions are defined, and a number of etch steps, M, is computed where M=[$\log_2$ N]

in which [. . . ] denotes "smallest integer greater than or equal to." It is convenient to denote the landing pad positions as P(0), P(1), . . . , P(N−1) and to arrange these numbers as the first row in a table at step 510.

At step 515 a determination is made as to whether N is odd or even. When N is even, a list of depth-of-etch integers is formed at step 520 in an arrangement:

1, 3, . . . , N−1, N−2, . . . , 4, 2, 0 where it will be noted that N−1 is odd and N−2 is even. The depth-of-etch integers represent levels of etches ED(•)(measured in numbers of OP layer pairs) to be performed at each landing pad position P(0), P(1), . . . , P(N−1). It is convenient to arrange the level numbers in tabular form by inserting them as the second row of the table constructed at step 510. As constructed, the table lists the landing pad positions in the first row; the second row denotes the depth of etch to be performed at each position.

When N is odd, a list of integers is formed at step 522 in a similar (but different) arrangement:

1, 3, . . . , N−2, N−1, . . . , 4, 2, 0 where it is noted that N−2 is odd, and N−1 is even. As before, the depth-of-etch integers represent levels of landing pad positions when the number of landing pads is odd.

Examples for N=10 (even) and N=11 (odd) are shown in respective TABLES 1 and 2, wherein the first row in the tables identifies an etch position (i.e., a landing pad position) according to step 510 and the second row in the tables defines a level for the indicated position (cf. steps 520 and 522).

TABLE 1

| Position | | | | | | | | | |
|---|---|---|---|---|---|---|---|---|---|
| 9 | 8 | 7 | 6 | 5 | 4 | 3 | 2 | 1 | 0 |
| Level | | | | | | | | | |
| 1 | 3 | 5 | 7 | 9 | 8 | 6 | 4 | 2 | 0 |
| ED(8) 0 | 0 | 0 | 0 | 1 | 1 | 0 | 0 | 0 | 0 |
| ED(4) 0 | 0 | 1 | 1 | 0 | 0 | 1 | 1 | 0 | 0 |
| ED(2) 0 | 1 | 0 | 1 | 0 | 0 | 1 | 0 | 1 | 0 |
| ED(1) 1 | 1 | 1 | 1 | 1 | 0 | 0 | 0 | 0 | 0 |

TABLE 2

| Position | | | | | | | | | | |
|---|---|---|---|---|---|---|---|---|---|---|
| 10 | 9 | 8 | 7 | 6 | 5 | 4 | 3 | 2 | 1 | 0 |
| Level | | | | | | | | | | |
| 1 | 3 | 5 | 7 | 9 | 10 | 8 | 6 | 4 | 2 | 0 |
| ED(8) 0 | 0 | 0 | 0 | 1 | 1 | 1 | 0 | 0 | 0 | 0 |
| ED(4) 0 | 0 | 1 | 1 | 0 | 0 | 0 | 1 | 1 | 0 | 0 |
| ED(2) 0 | 1 | 0 | 1 | 0 | 1 | 0 | 1 | 0 | 1 | 0 |
| ED(1) 1 | 1 | 1 | 1 | 1 | 0 | 0 | 0 | 0 | 0 | 0 |

At step 525 the depth-of-etch integers are expressed as M-digit binary numbers that are inserted as etch depth rows ED(·) into the table initiated at step 520 or 522.

An M-digit binary integer, q, may take values from 0 to M−1 which, for M=5, for example, may be represented in binary form as $b_4 b_3 b_2 b_1 b_0$ with each of the "b" digits being either zero or one. Such a representation interpreted to mean that $$q = b_0 \times 2^0 + b_1 \times 2^1 + b_2 \times 2^2 + \ldots + b_4 \times 2^4.$$

That is, each binary digit is associated with a power of two (1, 2, 4, 8, . . . ) in the binary representation of q. When M=5, $b_4$ is the most significant binary digit; $b_0$ is the least significant binary digit. For example, if q=21, then its binary representation is 10011 (i.e., 16+2+1).

For the example represented in TABLE 1, N=10, and M=4. The binary representation for each depth-of-etch integer is expressed in a column having etch depth (ED) rows that form the last four rows of the table. Most significant digits are placed in the third row; least significant digits are placed in the last row of the table. Etch depth rows are labeled ED(8), ED(4), ED(2), ED(1) in the first column of the table according to the power of two associated with the digits of the representation of each depth-of-etch integer.

Similarly, in the TABLE 2 example, N=11 and, again, M=4. Binary representations for the depth-of-etch integers are added to the table to create four etch depth rows in a manner similar to that employed in the construction of TABLE 1.

Mask/photo/etch procedures are then performed in sequence at step 530 by etching according to the rows of the binary digits. M etch steps are performed (M=4 in TABLES 1 and 2), with each etch step corresponding to an etch depth row in the table. Positions to be etched at each step are indicated by a "1" in each etch depth row. A depth of etch is performed at each step according to the label of the etch depth row (i.e., a power of two) measured in units of OP thickness.

Figure 11A:
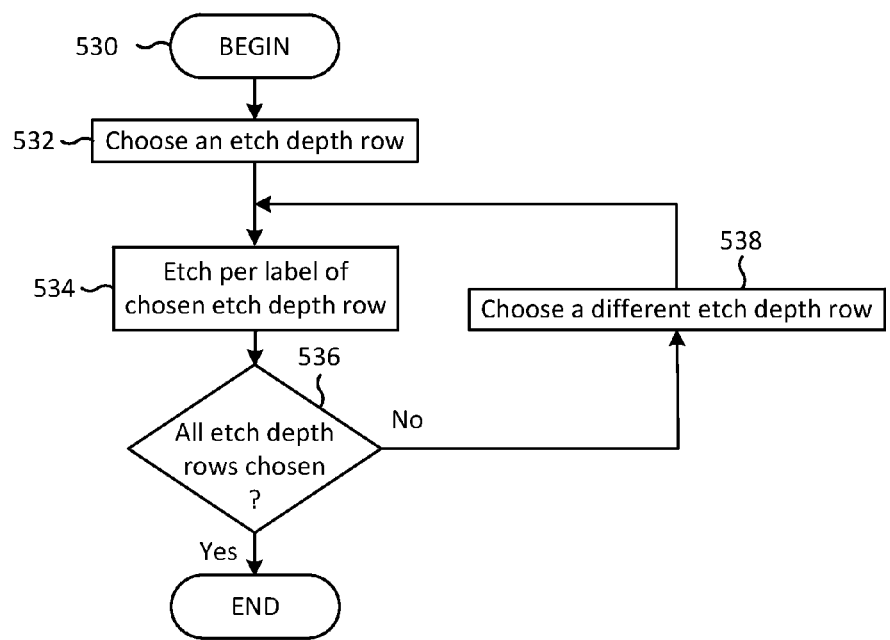
FIG. 11A is a flowchart showing detail of a step in the implementation of FIG. 11.

Detail of step 530 is illustrated as a flowchart in FIG. 11A according to one example. At step 532 one of the etch depth rows in the table is chosen, and an etch is performed at step 534 at positions having a "1" in the etch depth row to a depth indicated by the label of the etch depth row (i.e., a power of 2). If all etch depth rows have not yet been chosen per a check at step 536, then a different etch depth row (i.e., an etch depth row not already selected) is chosen at step 538. The process repeats at step 534 until etches have been performed corresponding to all etch depth rows.

Figure 12:
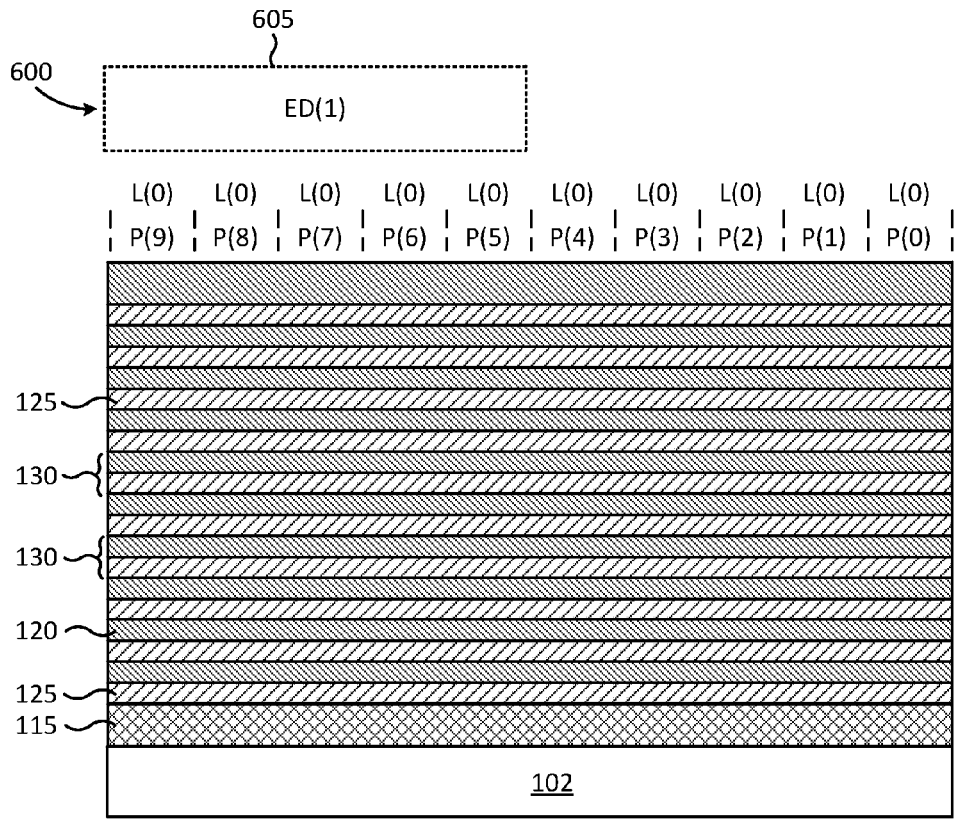
FIG. 12 is a cross-sectional view of an unprocessed semiconductor stack of ten OP layer pairs and a specification of a first etch step according to the implementation of FIGS. 11 and 11A.

One example using an even value of N (e.g., N=10) illustrates an implementation of the method using TABLE 1 and FIGS. 12-16 to define the sequence of etches. In this example, a semiconductor stack comprising ten OP layers is illustrated in FIG. 12. Etch positions P(0)-P(9) are identified. Initially, etch depths are noted to be L(0), corresponding to no etches having been performed.

Figure 13:
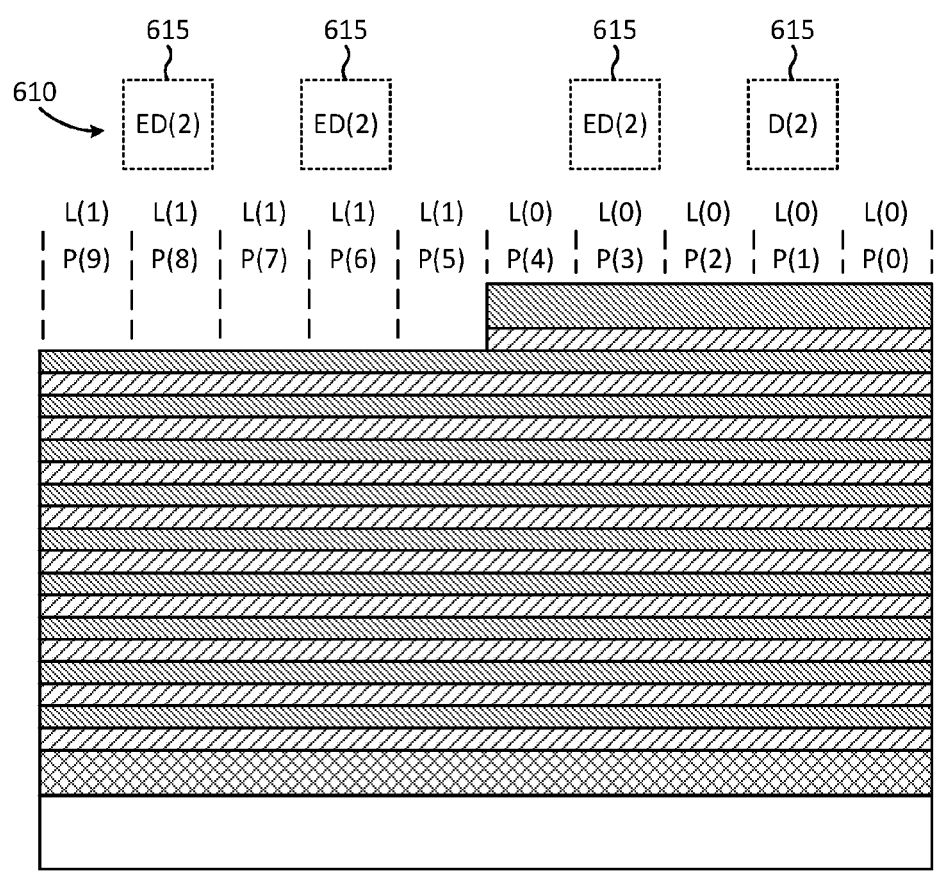
FIG. 13 illustrates a result of the first etch step and prescribes a second etch step to be applied to the structure of FIG. 12.

Following the flowchart of FIG. 11A, the etch depth row labeled ED(1) in TABLE 1 is selected at step 532, and a mask 600 (FIG. 12) is prepared according to each "1" appearing in the etch depth row ED(1). The landing pad positions to be etched are represented by the dotted rectangle 605 in FIG. 12. The etch is completed at step 534. The first etch removes one layer of material from positions P(5)-P(9) as shown in FIG. 13.

At step 536 it is noted that not all etch depth rows have yet been chosen, so the process continues at step 538 by choosing, for example, the etch depth row labeled ED(2), which is noted to have ones in positions P(1), P(3), P(6), and P(8). Accordingly, at step 534 a mask arrangement 610 (FIG. 13) is constructed, and an etch of depth 2 is performed based upon dotted rectangles 615, thereby removing 2 OP layer pairs from positions P(1), P(3), P(6), and P(8). The result of the second etch is illustrated in FIG. 14 showing that positions P(0), P(2), and P(4) have not been etched (i.e., level L(0)), positions P(5), P(7), and P(9) have been etched to level L(1), positions P(1) and P(3) have been etched to level L(2), and positions P(6) and P(8) have been etched to level L(3).

Figure 14:
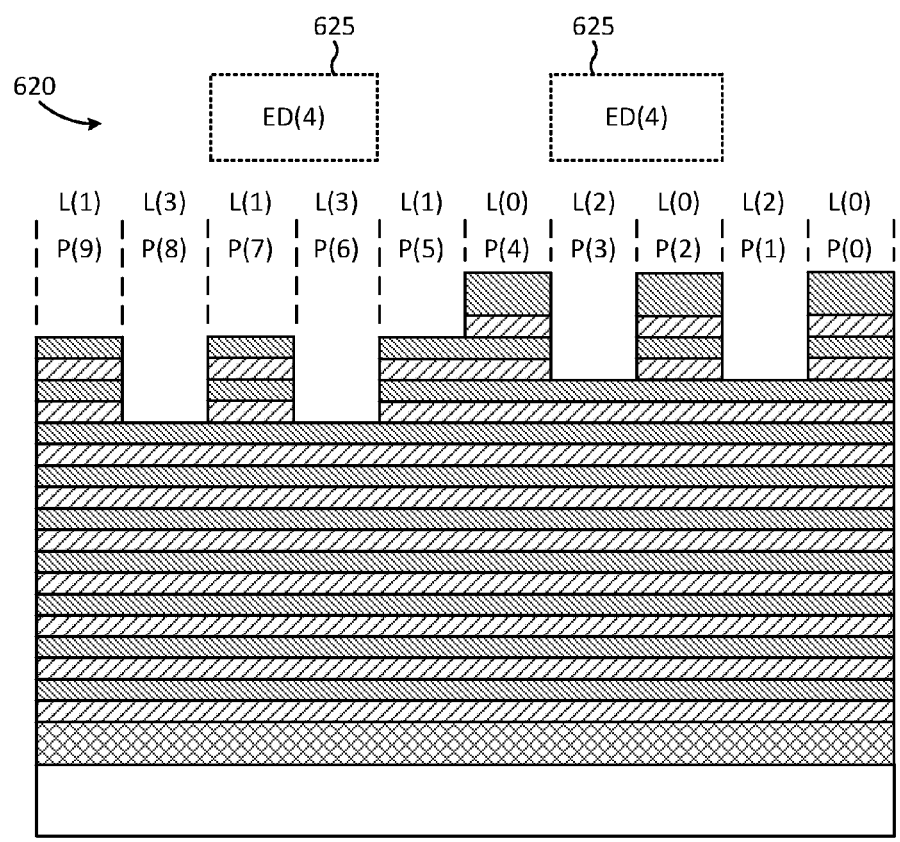
FIG. 14 is a cross-sectional view of a result of the second etch step and a prescription for a third etch step to be applied to the structure of FIG. 13.
Figure 15:
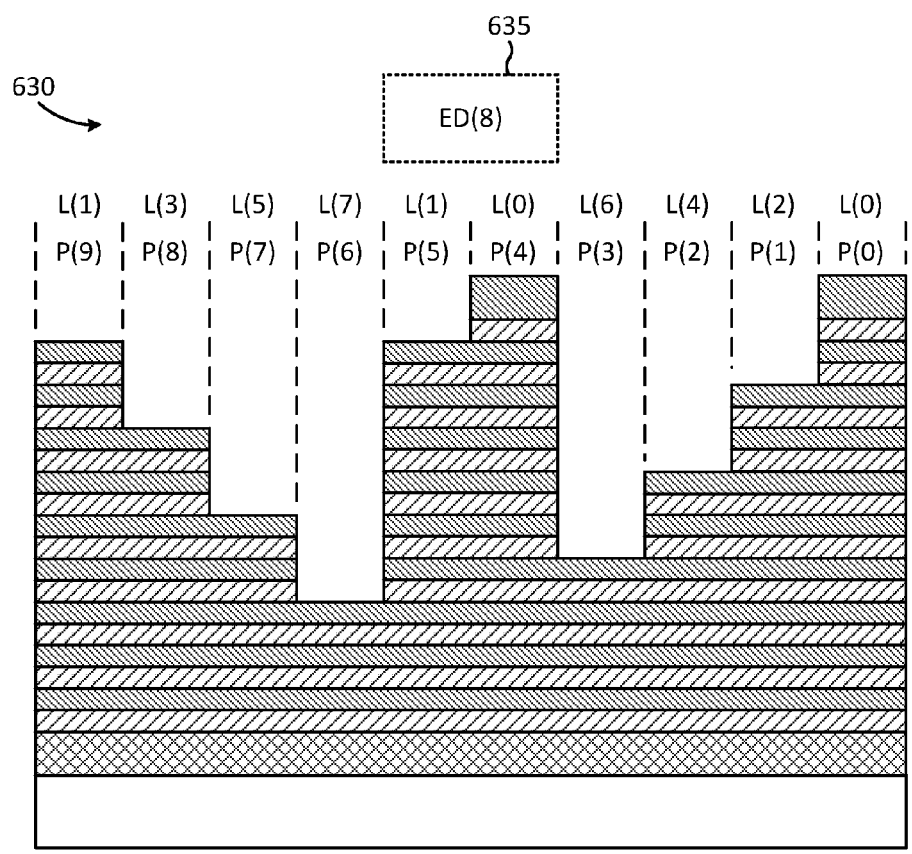
FIG. 15 is a representation of an effect of the third etch step applied to the structure of FIG. 14, showing a specified fourth etch step.

Continuing in a like manner, using the etch depth row labeled ED(4) in TABLE 1, a third etch (i.e., a four-level etch) is performed according to the mask arrangement 620 represented by dotted rectangles 625 in FIG. 14. The result of the third etch step is shown in FIG. 15.

Figure 16:
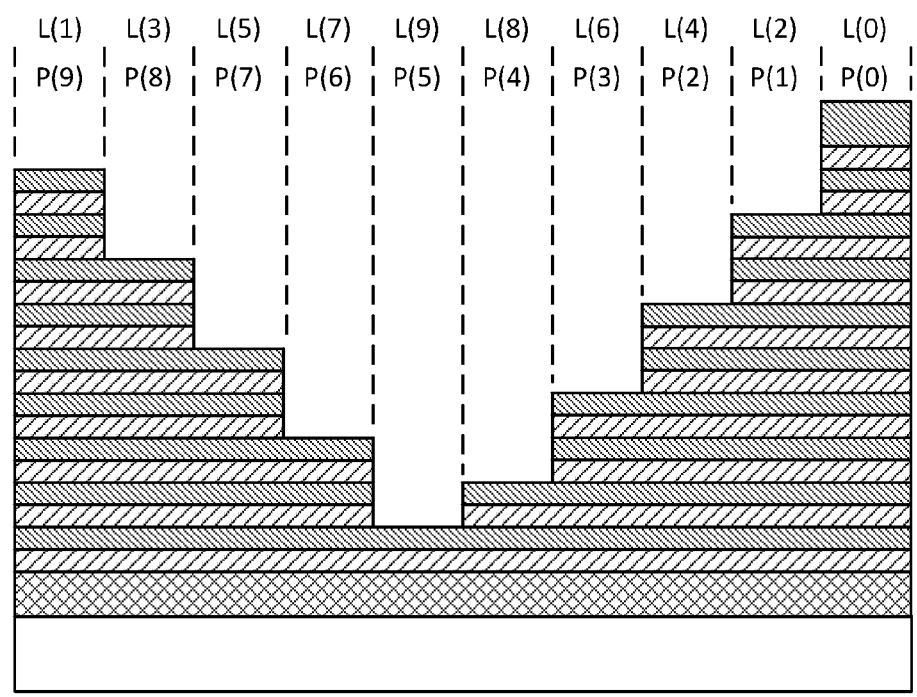
FIG. 16 illustrates a result of applying the fourth etch step to the structure of FIG. 15, illustrating that the maximum level difference between adjacent levels is a thickness of two OP level pairs.
Figure 17:
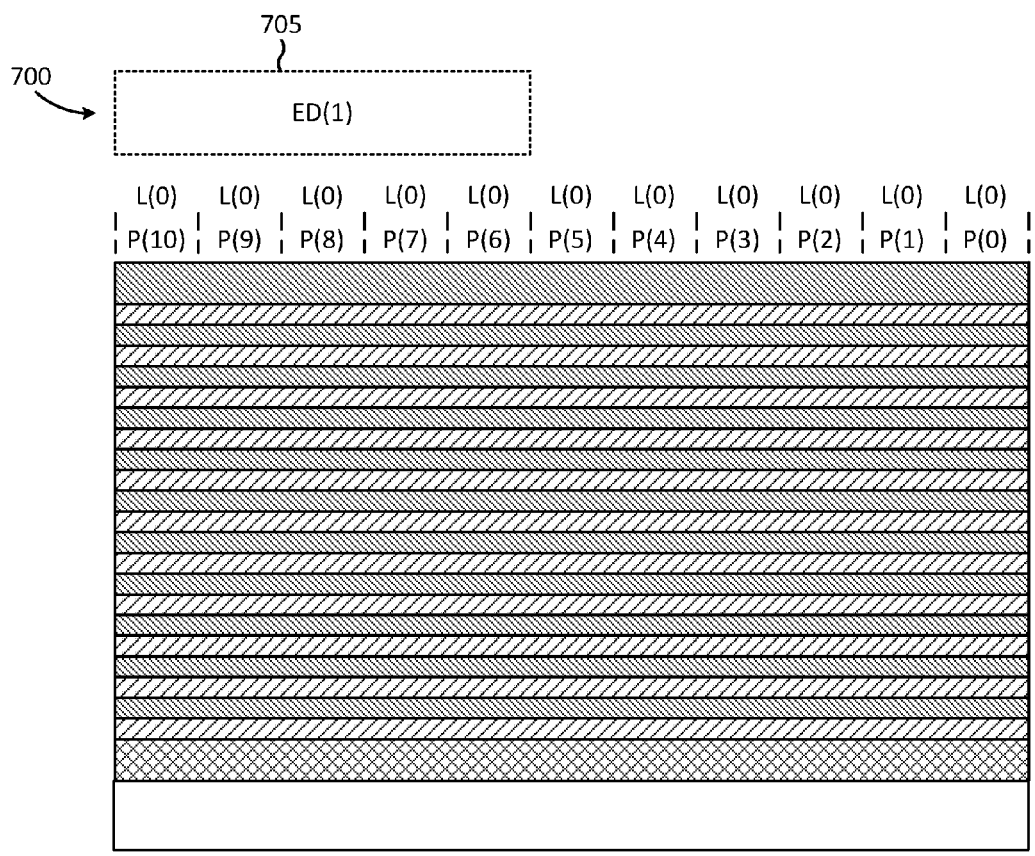
FIG. 17 describes a semiconductor stack having eleven OP layer pairs and specifies a first etch step.
Figure 18:
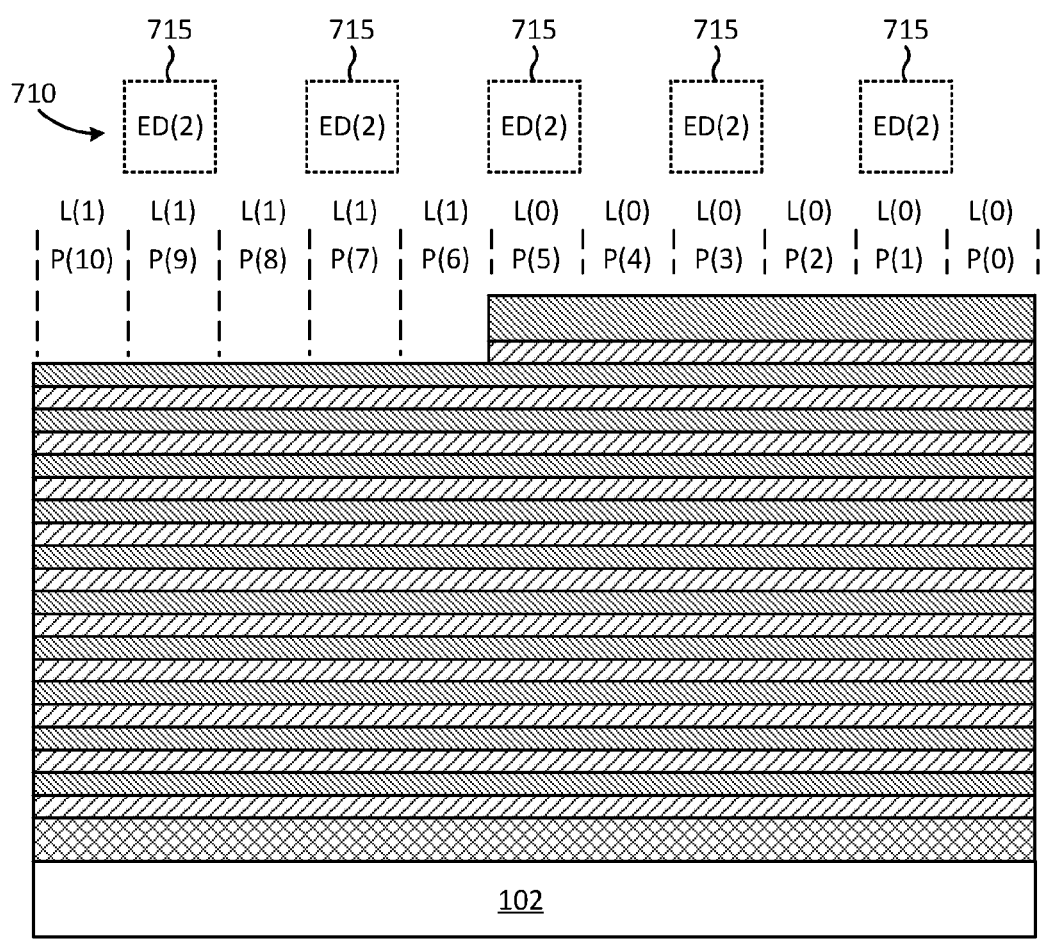
FIG. 18 shows the result of the first etch step and describes a second etch step to be applied to the structure of FIG. 17.
Figure 19:
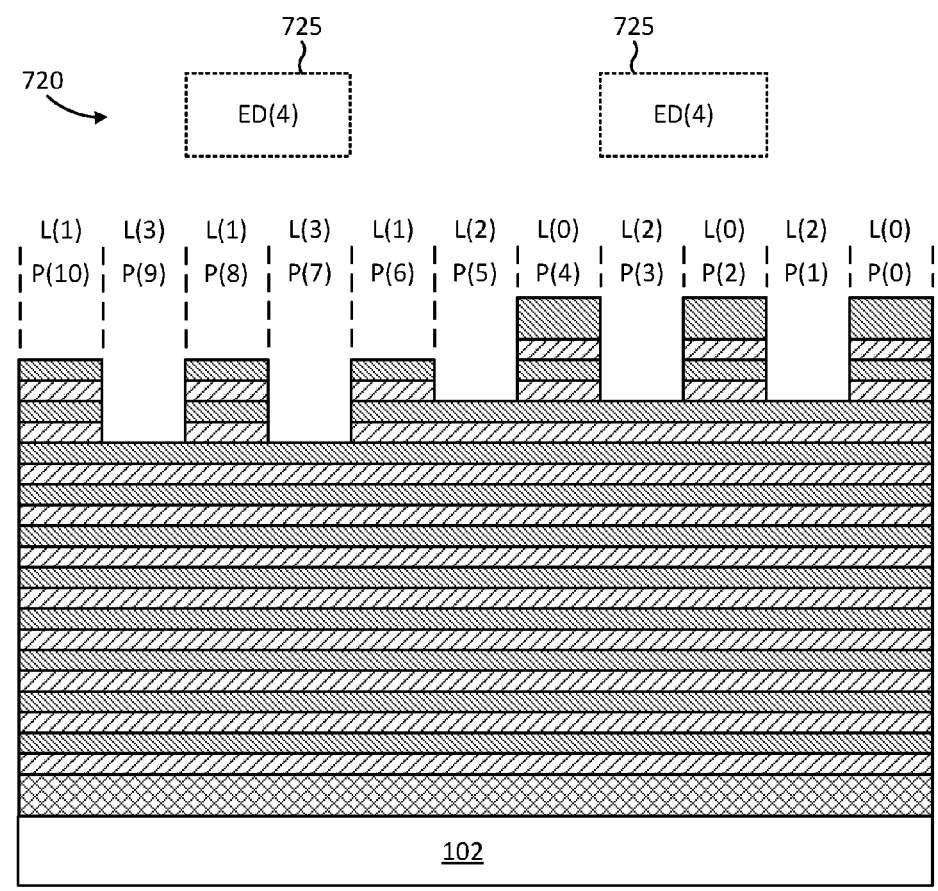
FIG. 19 illustrates the effect of application of the first two etch steps on the structure of FIG. 17 and specifies a third etch step.
Figure 20:
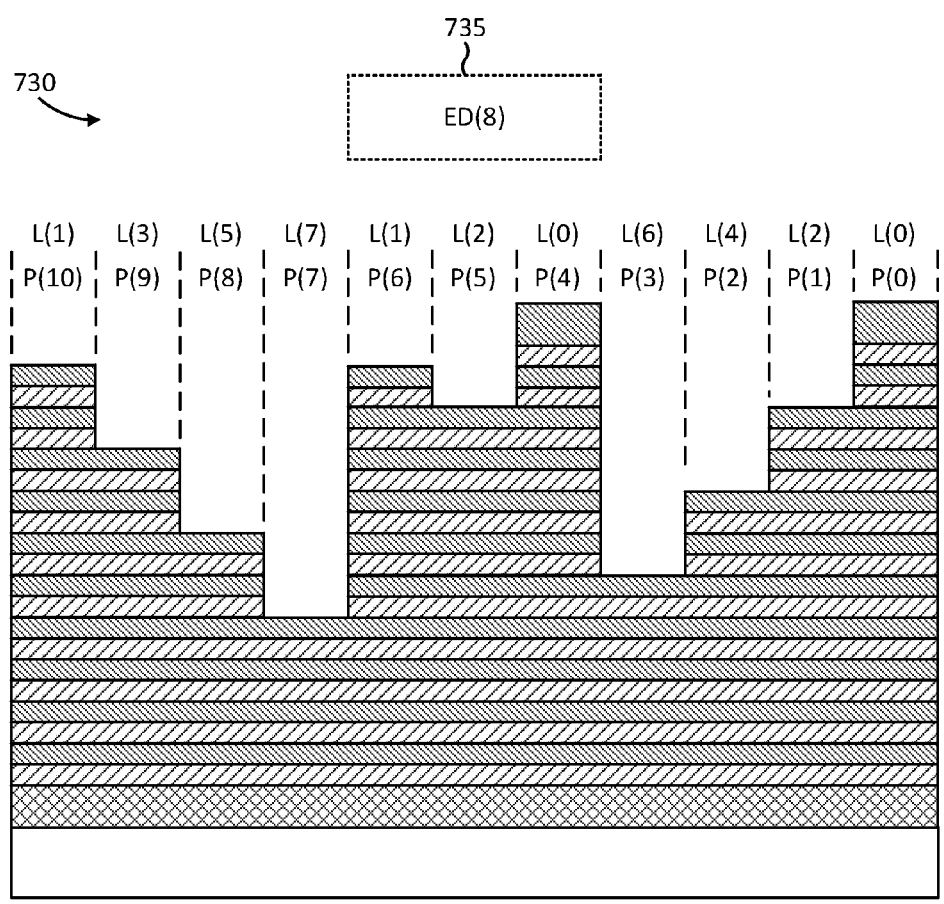
FIG. 20 depicts the result of the third etch step and prescribes a fourth etch step to be applied to the structure of FIG. 19.
Figure 21:
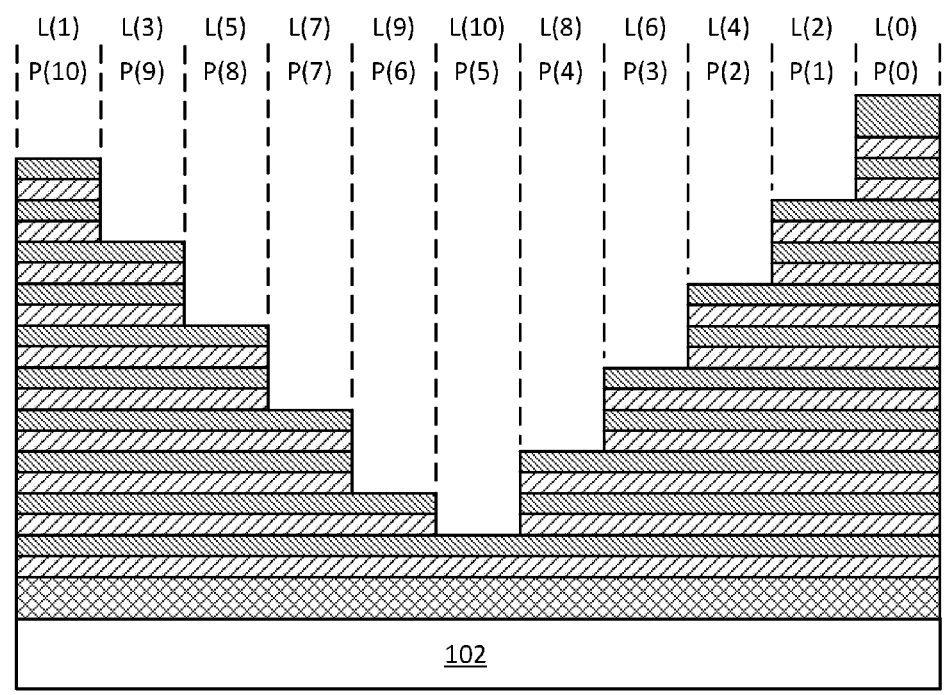
FIG. 21 shows a final result of the fourth etch step performed on the structure of FIG. 20, demonstrating that a maximum difference between adjacent levels is a thickness of two OP layer pairs.

Finally, a fourth etch step is performed using to ones in the etch depth row labeled ED(8) (i.e., etch depth is 8) in TABLE 1 according to a mask arrangement 630 comprising a dotted rectangle 635. The result of the final etch is illustrated in FIG. 16. As before, the height of no level differs from that of an adjacent level by more than 2 OP thicknesses.

FIGS. 17-21 illustrate results of a sequence of etches performed on a semiconductor stack comprising 11 OP layer pairs as described herein with reference to TABLE 2. The implementation uses an odd value of N (N=11) and follows steps similar to those illustrated above with reference to FIG. 11A and FIGS. 12-16.

Although the examples just given perform the etches in a particular order (i.e., performing etches of depth 1, 2, 4, 8 in sequence), the order of the etches is not critical, and may be varied. The examples presented herein also demonstrate that the level difference between consecutively numbered levels (e.g., the Level row in TABLES 1 and 2) is a thickness of one OP layer pair. Further, in all cases L(0) is noted to be the tallest (i.e., highest) level, and the highest-numbered level, L(N−1) is noted to be the shortest (i.e., lowest) level. Odd-numbered levels are grouped side by side, as are the even-numbered levels. The highest odd-numbered level and the highest even-numbered level are likewise positioned side by side. Additionally, the lowest odd-numbered level (i.e., L(1)) and the zero-numbered level (i.e., L(0)) are positioned to be furthest away from each other.

The examples of method implementations and resulting three-dimensional semiconductor memory structures created by the implementations demonstrate that the large maximum adjacent level difference problem identified above may be solved by making only minor changes in existing manufacturing processes.

Implementations of the method effectively rearrange positions of landing pads and corresponding connection points in higher layers (not shown) of the three-dimensional memory structure. This rearrangement improves the reliability of the LC modules without or substantially without having a detrimental effect on the functionality thereof. That is, for a structure having N LC module positions, the reduction in ECD is reduced by a factor of (N−1)/2 from (N−1)×(taper angle)×(OP thickness)

to

2×(taper angle)×(OP thickness).

The relative improvement achieved increases with the number of layers employed, as the maximum difference in height between adjacent landing pad levels is always 2 ×(OP thickness). The reduction in ECD identified in FIG. 2 is thereby virtually eliminated as are reductions in contact pattern overlay margin and issues of unwanted etch-through.

Although the disclosure herein refers to certain illustrated embodiments, it is to be understood that these embodiments have been presented by way of example rather than limitation. The intent accompanying this disclosure is to have such embodiments construed in conjunction with the knowledge of one skilled in the art to cover all modifications, variations, combinations, permutations, omissions, substitutions, alternatives, and equivalents of the embodiments, to the extent not mutually exclusive, as may fall within the spirit and scope of the invention as limited only by the appended claims.

What is claimed is:

1. A three-dimensional semiconductor memory structure comprising:
   a plurality of LC modules, the modules comprising:
      contact pads; and
      layer-by-layer openings enabling connection with the contact pads, wherein:
   the LC modules are disposed on a plurality of levels and have a plurality of different heights, each LC module being formed from one or more pairs of alternating layers of conducting material and insulating material (OP layer pairs), wherein no two adjacent LC modules differ in height by an amount greater than a thickness of two OP layer pairs and at least two adjacent LC modules differ in height by the thickness of two OP layer pairs.

2. The structure as set forth in claim 1, wherein the structure comprises 8 or fewer LC modules.

3. The structure as set forth in claim 1, wherein the structure comprises more than 8 LC modules.

4. The structure as set forth in claim 1, wherein each LC module is designated as odd-numbered or even-numbered, the LC module identified by zero being designated as even-numbered.

5. The structure as set forth in claim 4, wherein a height difference between surfaces of consecutively numbered LC modules is a thickness of one OP layer pair.

6. The structure as set forth in claim 4, wherein:
   the surface of the zero-numbered LC module is the highest surface; and
   the surface of the highest-numbered LC module is the lowest surface.

7. The structure as set forth in claim 6, wherein the odd-numbered LC modules are grouped side by side and the even-numbered LC modules are grouped side by side so that the surface of the LC module having the highest odd number is adjacent the surface of the LC module having the highest even number.

8. The structure as set forth in claim 6, wherein the lowest odd-numbered LC module and the zero-numbered LC module are positioned to be furthest away from each other.

9. A structure comprising alternating pairs of layers of insulating material and conducting material configured to form a plurality of LC modules of a three-dimensional semiconductor memory array, the plurality of LC modules having a plurality of different heights; and wherein:
   the alternating layers form distinct surfaces; and
   no two adjacent LC modules differ in height by an amount greater than a thickness of two pairs of conducting/insulating layers and at least two adjacent LC modules differ in height by a thickness of two pairs of conducting/insulating layers.

10. The structure as set forth in claim 9, wherein the conducting material comprises polysilicon.

11. The structure as set forth in claim 9, wherein the insulating material is selected from SiO2, SiOC, SiOF and combinations thereof.

12. The structure as set forth in claim 9, wherein the number of pairs is a positive integer power of 2.

13. The structure as set forth in claim 9, wherein the number of pairs is an even number.

* * * * *